(12) United States Patent
Kimura

(10) Patent No.: US 7,121,842 B2
(45) Date of Patent: Oct. 17, 2006

(54) ELECTRICAL CONNECTOR

(75) Inventor: Ken Kimura, Kuroishi (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 10/542,687

(22) PCT Filed: Jan. 13, 2004

(86) PCT No.: PCT/JP2004/000150

§ 371 (c)(1),
(2), (4) Date: Jul. 19, 2005

(87) PCT Pub. No.: WO2005/069447

PCT Pub. Date: Jul. 28, 2005

(65) Prior Publication Data

US 2006/0183356 A1    Aug. 17, 2006

(30) Foreign Application Priority Data

Feb. 17, 2003 (DE) .......................... 103 07 330

(51) Int. Cl.
*H01R 12/00* (2006.01)
(52) U.S. Cl. ........................ 439/73; 439/70; 439/525
(58) Field of Classification Search ................ 439/70, 439/72, 73, 525, 862, 66
See application file for complete search history.

(56) References Cited

U.S. PATENT DOCUMENTS

| 4,445,735 | A | * | 5/1984 | Bonnefoy | 439/66 |
| 5,388,996 | A | | 2/1995 | Johnson | 439/65 |
| 5,609,489 | A | * | 3/1997 | Bickford et al. | 439/72 |
| 5,888,075 | A | | 3/1999 | Hasegawa et al. | 439/73 |
| 6,019,612 | A | * | 2/2000 | Hasegawa et al. | 439/73 |

FOREIGN PATENT DOCUMENTS

| JP | 07-073943 | 3/1995 |
| JP | 11-031566 | 2/1999 |
| JP | 2003-123874 | 4/2003 |
| JP | 2003-232805 | 8/2003 |
| JP | 2003-297506 | 10/2003 |

* cited by examiner

*Primary Examiner*—Tho D. Ta
(74) *Attorney, Agent, or Firm*—Robert J. Rose; Michael Fedrick; Sheldon & Mak PC (57) ABSTRACT

An electrical connecting apparatus comprises: a plurality of plate-like probes, each of which electrically connects an electrode of a device under test and a conductive portion formed in a base plate, and each of which has a tip to be pressed against the electrode on one end side of the probe and a curved outer face on one side in the width direction of the probe, and each of which further has a first recess opening on the one side; and an assembler for assembling the probes into the base plate such that the probes are arranged at intervals in the thickness direction and that the tips are projected to the side opposite to the base plate.

6 Claims, 6 Drawing Sheets

ELECTRICAL CONNECTOR

CROSS-REFERENCE TO RELATED APPLICATION

This Application claims priority from International Application Number PCT/JP2004/000150, titled "Electrical Connecting Apparatus," filed Jan. 13, 2004.

FIELD OF ART

The present invention relates to an electrical connecting apparatus for use in an electrical test of a flat plate-like device under test such as an integrated circuit, and more particularly, to an apparatus for electrically connecting electrodes of a device under test and conductive portions formed in a base plate.

BACKGROUND ART

A packaged semiconductor device has a plurality of leads, that is, electrodes projected from a package body. The semiconductor device of this type is electrically tested by using an electrical connecting apparatus called socket. Such electrical connecting apparatus are described in Patent Documents 1 and 2.

[Patent Document 1] Japanese Patent Appln. Public Disclosure No. 11-31566 Official Gazette

[Patent Document 2] Japanese Patent Appln. Public Disclosure No. 2003-297506 Official Gazette Each of the electrical connecting apparatus described in Patent Documents 1 and 2 comprises a plurality of probes having a curved portion, a cover on which the probes are arranged in parallel, and a stick-like needle presser arranged in a cover so as to extend in the arranging direction of the probes.

The cover is attached to a base plate such as a wiring base plate by means of a plurality of screw members. The probes are pressed at the outer surfaces of the curved portions against a conductive portion of the base plate by the needle presser in a state that the cover is attached to the base plate.

The device under test, whose electrodes are pressed against the tips (needle tips) of the probes, is electrically connected to the electrodes of the base plate by the probes.

In such an electrical correcting apparatus as above, however, the outer surfaces of the curved portions of the probes are only pressed against the conductive portions of the base plate with the cover attached to the base plate, the probes tend to fall from the cover in a state before the cover is attached to the base plate, thus making an assembling work troublesome.

SUMMARY OF THE INVENTION

The electrical correcting apparatus according to the present invention comprises: a plurality of plate-like probes, respectively electrically connecting electrodes of devices under test and a conductive portion formed in the base plate, and having the tips to be pressed against the electrodes at one end side of the probes and having the curved outer surfaces on one side in the width direction of the probes and further having a first recess opening on the one side; and an assembler for assembling the probes into the base plate at intervals in the thickness direction with the tips projected toward the side opposite to the base plate.

The assembler is provided with: a cover having a second recess extending in the arranging direction of the probes and opening on the side of the base plate; a falling-off preventing member disposed in the second recess so as to extend in the arranging direction of the probes and fitted into the first recess so as to prevent the probes from falling off the cover; and a needle presser extending in the arranging direction of the probes and disposed in the second recess so as to have the outer surfaces of the probes contact the conductive portion.

In the electrical connecting apparatus according to the present invention, the probes are assembled into the cover in a state of being interposed between the falling-off preventing member and the needle presser. Therefore, the probes are prevented from falling off the cover, thereby facilitating a work to assemble the apparatus.

The falling-off preventing member may be received in the first recess in a state of close fit. Thus, the probes are prevented from coming off the falling-off preventing member, thereby surely preventing the probes from falling off the cover.

The probes may further have a third recess opening on the other side in the width direction, and at least a part of the needle presser may be fitted into the third recess. This stabilizes the position of the probes relative to the cover.

The cover may have a plurality of slots communicating to the second recess and opening on the side of the base plate as well as the opposite side thereto at intervals in the arranging direction of the probes, and the probes may extend in the slot to project their tips from the slots toward the side opposite to the base plate.

The cover further has a fourth recess opening on the side opposite to the base plate so as to receive the device under test and a fourth recess communicating to the slot, and the probes may project their tips into the fourth recess.

The cover further has a fifth recess communicating to an end in the longitudinal direction of the second recess, and the falling-off preventing member may be fitted into the fifth recess at the longitudinal end portion. Thereby, the falling-off preventing member is prevented from coming off the cover, thereby surely preventing the probes from falling off the cover.

The probes may be pressed against the conductive portion by the needle presser. Thereby, the probes and the conductive portions are surely connected electrically.

The probes may be brought into contact with the surface forming the second recess on the other end side. Thereby, when the electrodes of the device under test pressed against the tips of the probes are displaced along the curved outer surfaces of the probes, the probes and the conductive portion are surely connected electrically.

DETAILED DESCRIPTION

Referring to FIGS. 1–6, the electrical connecting apparatus 10 is used as an auxiliary apparatus for use in an examination or a test of a flat plate-like device under test 12. The device under test 12 is a semiconductor device such as a packaged or molded integrated circuit in the illustration, in the present invention, but can be also applied to an electrical connecting apparatus for testing another flat plate-like device under test such as a liquid crystal display panel.

The device under test 12 has a body 14 packaged or molded into a rectangular planar shape, and a plurality of leads, i.e., electrodes 16 projecting outward from a position corresponding to each side of the rectangle of the body 12. The electrodes 16 are divided into a plurality of electrode groups made to correspond to each side of the rectangle of the body 14 and are arranged in parallel for each electrode group.

The connecting apparatus 10 comprises: a base plate 20 such as a wiring base plate; a plurality of plate-like contacts, i.e., probes 22 made to correspond individually to the electrodes 16; a plurality of elongated falling-off preventing members 24 for preventing the probes 22 from falling; a plurality of elongated needle pressers 26; and a plate-like cover 28 in which the probes 22, the falling-off preventing members 24 and the needle pressers 26 are disposed.

The base plate 20 is a wiring base plate in which a wiring pattern is formed on one of the faces of a plate 30 made of an electrically insulating material by a printed wiring technique, and which has on one of the faces a plurality of strip-like wirings, i.e., conductive portions 32 respectively corresponding to the probes 22. Each conductive portion 32 constitutes a part of the wiring pattern. The conductive portions 32 are divided into a plurality of conductive portion groups individually corresponding to the sides of the rectangle of the body portion 14 of the device under test 12 and are arranged in parallel for each conductive portion groups in the neighborhood of the probes 22.

Each probe 22 is made of a conductive metal material and is arranged in the cover 28 such that its width direction becomes the up and down direction (the thickness direction of the cover 28).

Each probe 22 has the tip 34 to be pressed against the electrode 16 of the device under test 12 on the one end (tip) side, and a curved outer face 36 on one side of the width direction, and further, a recess 38 opening on the side of the outer face 36 as well as a recess 42 opening on the side of the inner face 40 opposite to the outer face 36.

The tip 34 of each probe 22 is curved like an arc so as to act as a needle point, and has a width dimension smaller than its tail portion. The outer face 36 is formed in a central portion ranging from the tail portion of the probe 22 to the tip 34. The recesses 38 and 42 are formed in the tail portion of the probe 22.

The tail portion of each probe 22 is made linear extending in the width direction of the probe 22. However, the upper and lower corner angle portions of the tail portion of each probe 22 are made arc-like faces with a small radius of curvature.

The probes 22 are divided into a plurality of probe groups individually corresponding to the sides of the rectangle of the body 14 of the device under test 12. In the illustration, since each of the four sides of the rectangle of the device under test 12 has a plurality of electrodes 16, the probes 22 are divided into four probe groups. For the same reason, in the illustration, four falling-off preventing members 24 and four needle pressers 26 are provided.

Each falling-off preventing portion 24 and each needle presser 26 are made of an elastically deformable electrically insulating rubber material such as silicone rubber in square timber-like and round bar-like shapes. Each falling-off preventing portion 24 and each needle presser 26, however, may be shaped otherwise, and among others, it may be hollow.

The cover 28 has: an opening, i.e., a recess 44 formed in the center and opening upward so as to accommodate the device under test 12; a plurality of slots 46 extending outward from the recess 44; and a plurality of recesses 48 formed outside the recess 44 and continuously extending in the arranging direction of the slots 46. Such a cover 28 can be formed of a non-conductive material such as a synthetic resin.

The recess 44 has a rectangular planar shape similar to the body 14 of the device under test 12. The upper portion of the recess 44 is made smaller downward by an inclined plane 50 which is directed from the outside toward the center.

The slots 46, which are slots accommodating at least the tips and the central portions of the probes 22, are provided as many as the probes 22.

The slots 46 are divided into a plurality of slot groups individually corresponding to the sides of the rectangle forming the recess 44 and are spaced apart in the arranging direction of the probes 22 to each slot group. Each slot 46 opens on the side of the base plate 20, that is, downward, and opens to the recess 44 and the recess 48.

The recesses 48 individually correspond to the sides of the rectangle forming the recess 44 and extend along the corresponding sides. In the illustration, there are provided four recesses 48. Each recess 48, which is a groove accommodating the falling-off preventing member 24 and the needle presser 26, opens to the tail portion of the corresponding slot 46 and opens downward.

The cover 28 is laid on the base plate 20 such that the recess 48 comes to the side of the base plate 20, and is removably mounted on the base plate 20 by a plurality of screw members 52 such as bolts. Each screw member 52 penetrates the cover 28 in its thickness direction and is screwed into a threaded hole formed in the base plate 20.

Each probe 22 is disposed in the cover 28 such that the tail portion is positioned in the recess 48, that the central portion is positioned in the slot, and that the tip is projected into the recess 44, with the tail portion brought into contact with the outer side face 54 forming the recess 48.

Figure 1:
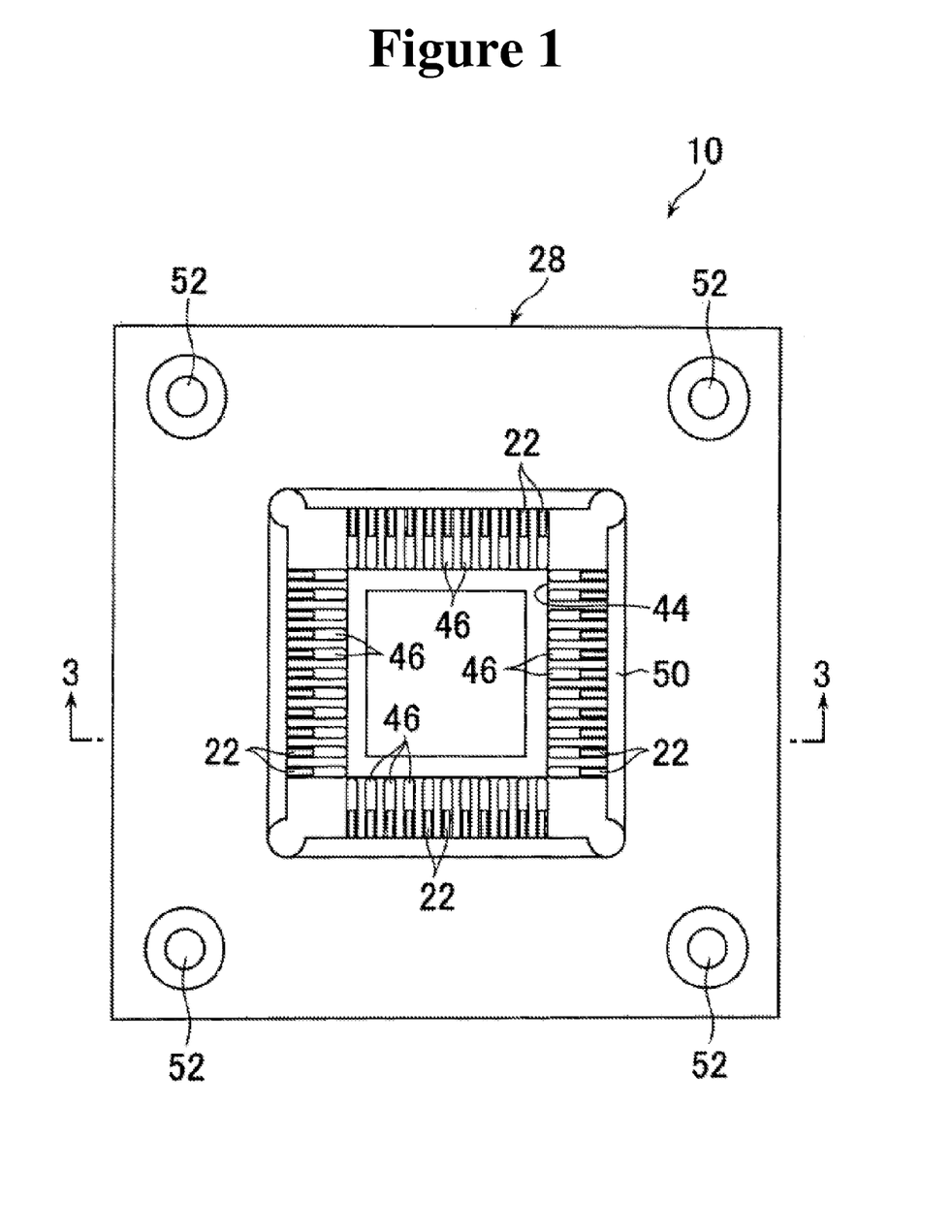
FIG. 1 is a plan view showing a first embodiment of the electrical connecting apparatus according to the present invention.
Figure 2:
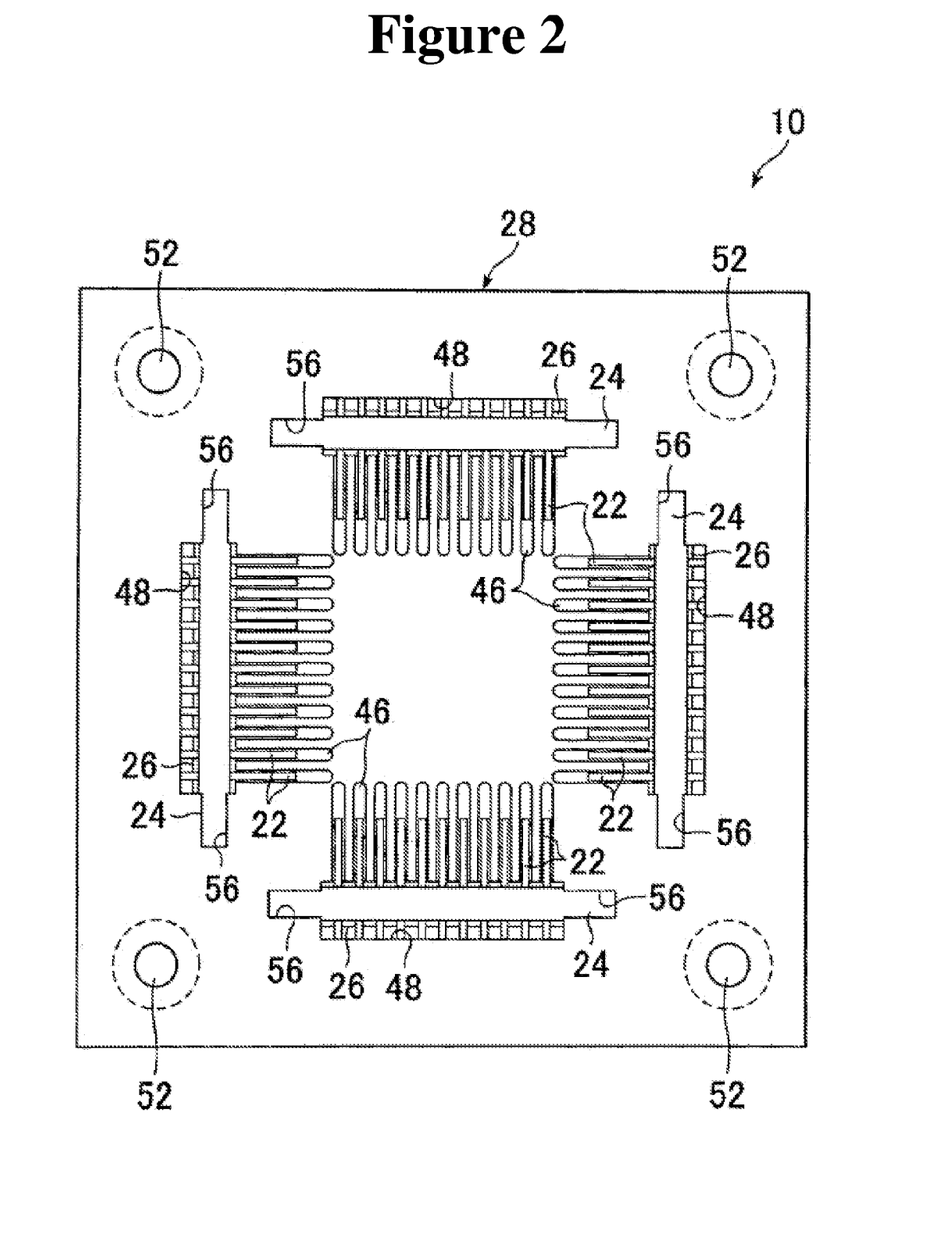
FIG. 2 is a bottom view of the electrical connecting apparatus shown in FIG. 1.
Figure 3:
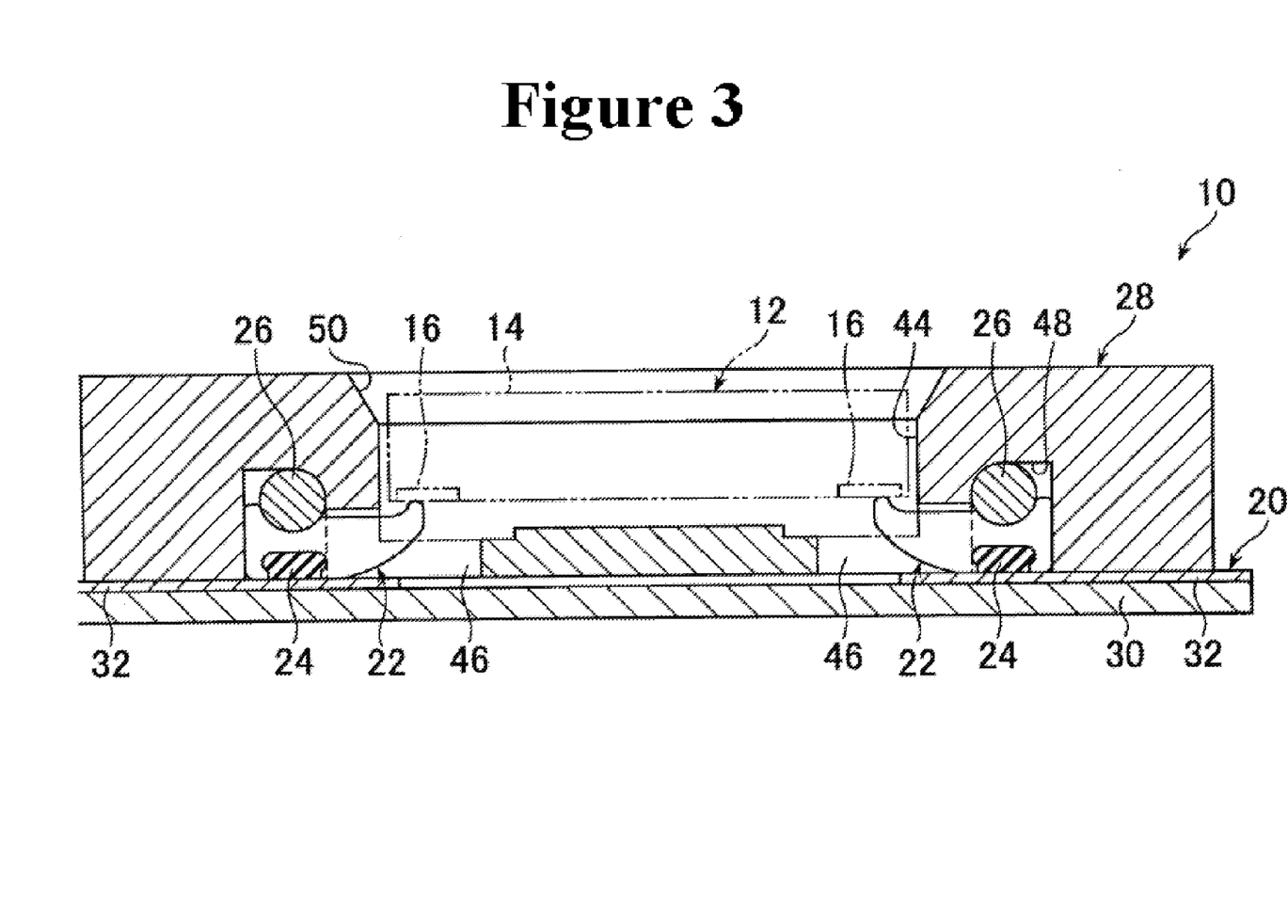
FIG. 3 is a section obtained along the line 3—3 in FIG. 1.

Each falling-off preventing member 24 is fitted into the recess 38 of the corresponding probe 22 in a state of close fit and disposed in the recess 48. Each needle presser 26, at least a part of which is received in the recess 42 of the corresponding probe 22, is disposed in the recess 48. The width dimension of both ends 56 of each recess 48 is made smaller than that of the central portion as shown in FIG. 2, thereby preventing the falling-off preventing member 24 from falling from the cover 28.

The connecting apparatus can be assembled in the following manner.

In the first place, four probe assemblies are fabricated by fitting the falling-off preventing members 24 into the recesses 38 of the probes 22 of the corresponding probe groups. Especially, when the falling-off preventing member 24 is fitted into the recess 38 in a state of close fit, the probe 22 is surely prevented from coming off the falling-off preventing member 24.

Concurrently with the above, each needle presser 26 is disposed in the recess 48.

Next, the probes 22 of each probe group are passed through the corresponding slots 46 from the side of the corresponding recesses 48, and both end portions of the falling-off preventing member 24 are fitted into both ends 56 of the recess 48 such that the tail portion of each probe 22 contacts the face 54 of the recess 48 and that the tip 34 of each probe is projected. By this, the probes 22 are held by the falling-off preventing members 24 and the needle pressers 26.

Then, the cover 28 is laid on the base plate 20, with the probe 22, the falling-off preventing member 24 and the needle presser 26 disposed as mentioned above, and is mounted on the base plate 20 in that state by the screw members 52.

To decompose the assembled connecting apparatus 10, the above-mentioned operation is reversed.

In such an assembled state, the probes 22 are pressed against the conductive portions 32 of the base plate 20 at a part of the outer face 36 by the needle pressers 26, sandwiched between the base plate 20 and the needle presser 26, and is maintained in that state. Consequently, the probe 22 is surely prevented from falling off the cover 28, thereby surely connecting the probes 22 and the conductive portions 32 electrically.

As mentioned above, when a part of the needle presser is fitted into the recess 42 of the probe 22, the position of the probe relative to the cover becomes stable. Also, when both end portions of the falling-off preventing member 24 are fitted into the end portions of the recess 48, falling of the falling-off preventing member 24 from the cover 28 is prevented, so that falling of the probe 22 from the cover 28 is surely prevented.

In the illustration, the falling-off preventing members 24, the needle presser 26, the cover 28 and the screw members 52 act as an assembler for assembling the probes 22 into the base plate 20.

When testing, the device under test 12 is put into the recess 44 from above. At this time, if the position of the device under test 12 relative to the connecting apparatus is displaced, the device under test 12 contacts the inclined plane 50 and is guided to the center of the recess 44 by the inclined plane 50. By this, the device under test 12 is accommodated in the connecting apparatus 10 with the electrode 16 brought into contact with the tip of the probe 22.

Figure 4:
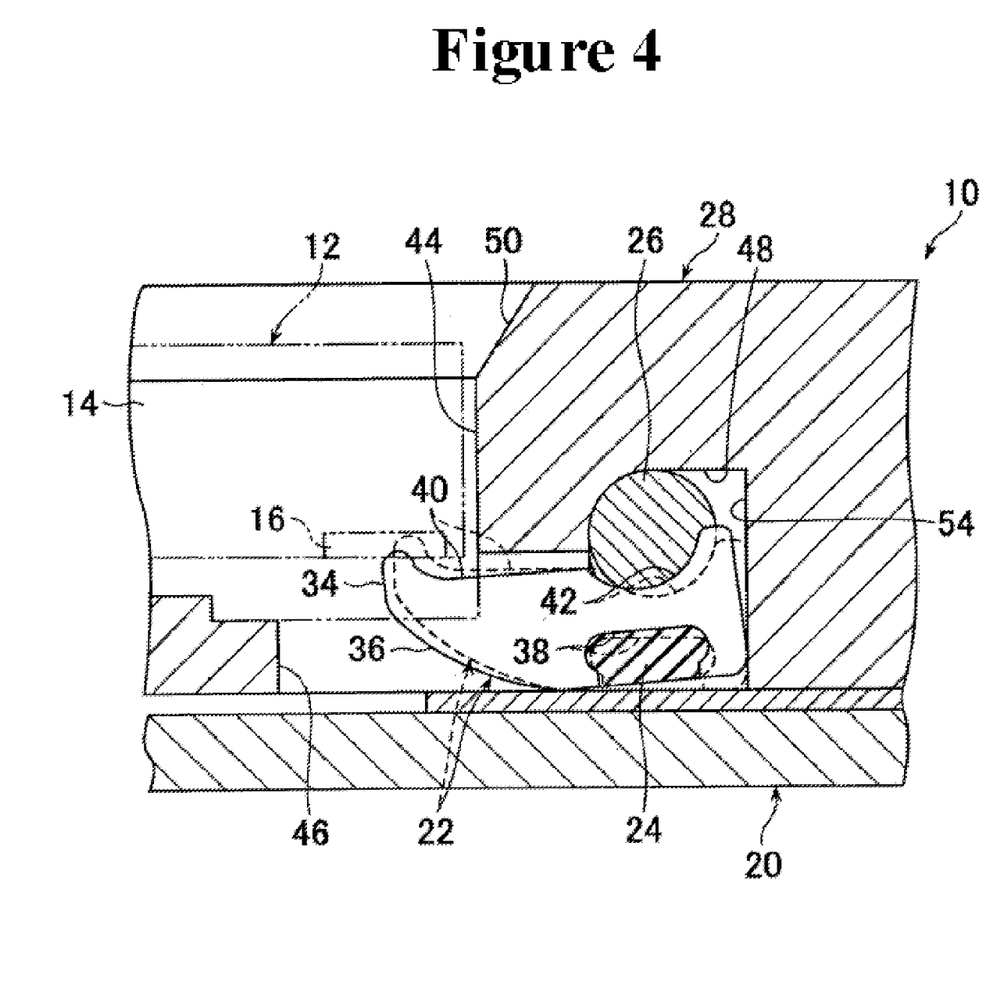
FIG. 4 is a partly enlarged section of FIG. 3.
Figure 5:
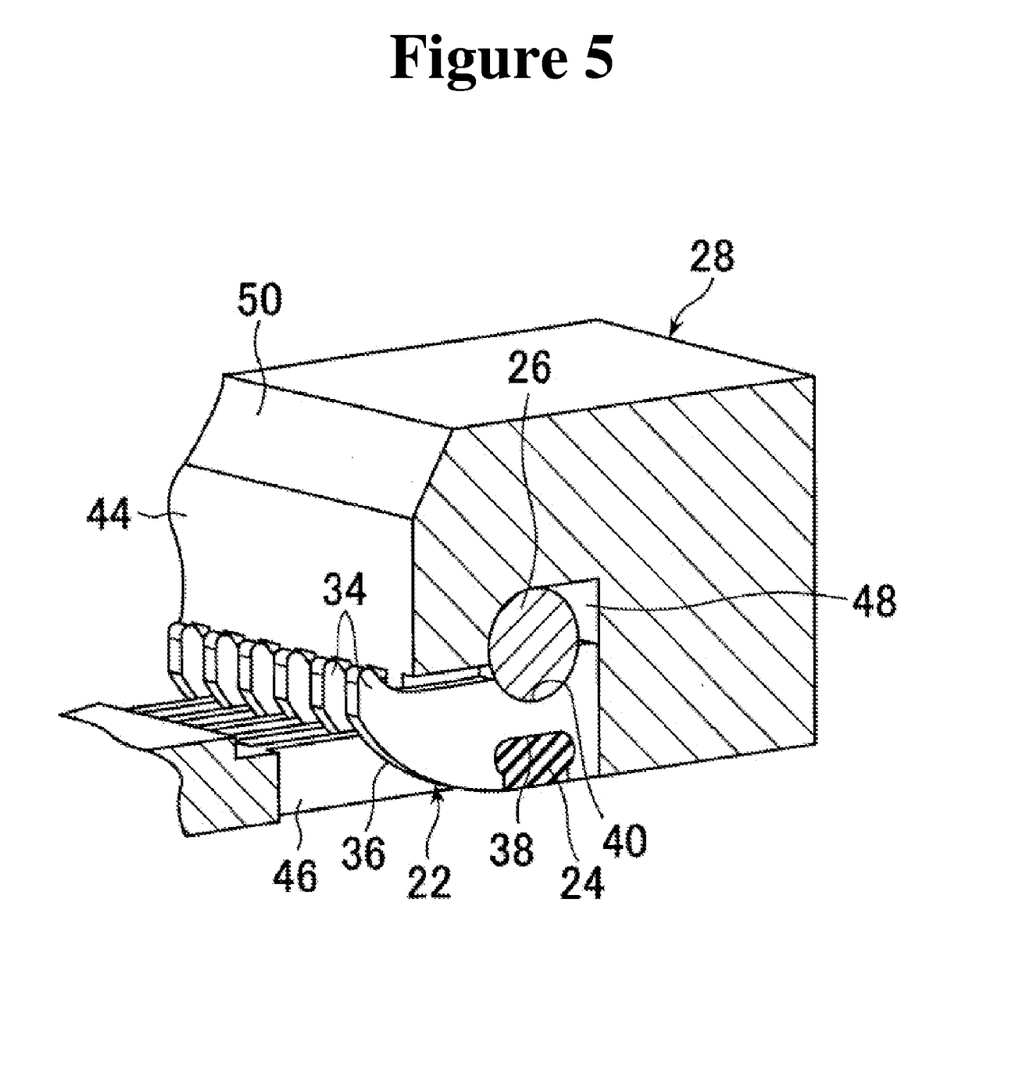
FIG. 5 is a perspective view partly in section showing the relation between the probe and the cover.
Figure 6:
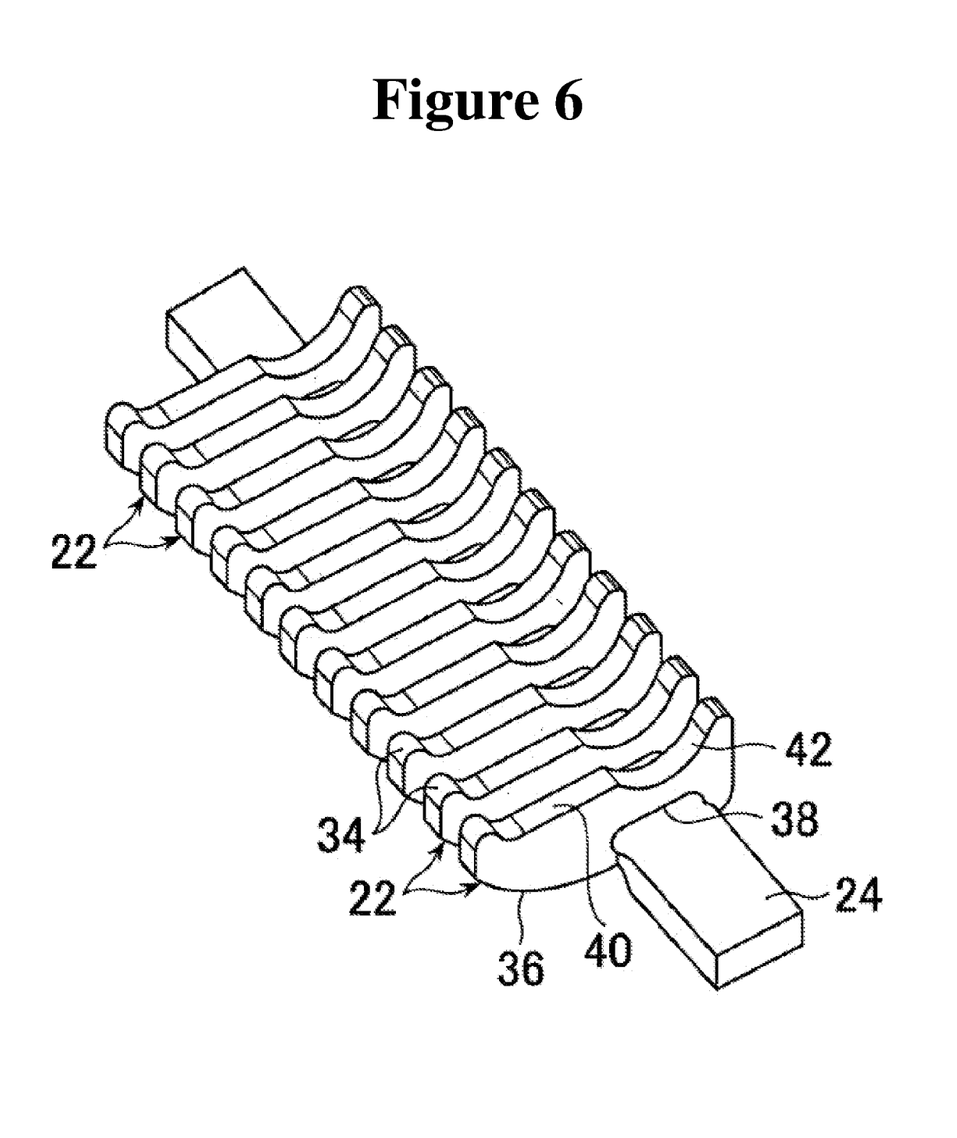
FIG. 6 is a perspective view partly in section showing the relation between the probe and the falling-off preventing material.

When the device under test 12 disposed in the connecting apparatus 10 is pushed down by a pressing body not shown, each probe 22, receiving an over drive action, is elastically deformed into a state shown by a solid line from a state shown by a dotted line shown in FIG. 4. At this time, force for making the probe 22 retreat along its outer face 36 acts on the probe 22.

However, since the tail of each probe 22 is in direct contact with the face 54 of the recess 48, each probe 22 displaces in a state shown by a solid line in FIG. 4 with the lower part of the tail as a fulcrum, and elastically deforms the needle presser 26.

By this, the tip 34 of each probe 22 is displaced in the longitudinal direction of the probe 22 relative to the electrode 16 and the contact portion of the probe 22 with the conductive portion 32 moves to the side of the tip 34, thereby causing a rubbing action (or scraping action) to eliminate a part of an oxide film existing on the surface of the electrode 16.

As mentioned above, when the device under test 12 is pushed down by the above-mentioned pressing body, since each probe 22 is pressed against the conductive portion 32; therefore, each probe 22 may be made not pressed against the conductive portion 32 by the needle presser 26 in a state of being assembled into the electrical connecting apparatus or in a state that the device under test 12 is not pushed down by the pressing body.

According to the connecting apparatus 10, as mentioned above, the shape of the probe 22 is simple, so that not only the price of the probe 22 becomes cheap but also the electrical effective length of the probe 22 is small to suit a high frequency test, and though the probes 22 can be kept stable, the connecting apparatus is easily fabricated. Also, the device under test 12 is naturally and correctly disposed in the connecting apparatus 10, the electrode 16 of the device under test 12 surely contacts the tip 34 of the probe 22, and the probe 22 elastically deforms the needle presser 26, thereby effectively causing the scraping action to the electrode 16. Furthermore, the structure of the needle presser 26 being simple, electric short-circuit among the probes 22 can be surely prevented.

INDUSTRIAL APPLICABILITY

The present invention is not limited to the above embodiments but can be variously modified without departing from its purport.

The invention claimed is:

1. An electrical connecting apparatus for electrically connecting electrodes of a device under test and conductive portions formed in a base plate, comprising:
   a plurality of plate-like probes each for electrically connecting one of the electrodes and one of the conductive portions, having a tip to be pressed against the one electrode on one end of said probe and a curved outer face on one side of the width direction of said probe and further having a first recess opening on said one side; and
   an assembler for assembling said probes onto the base plate such that said probes are arranged at intervals in the thickness direction and that said tips are projected on the side opposite to the base plate, wherein said assembler comprises:
   (i) a cover having a second recess elongated in the arranging direction of said probes and opening on the side of the base plate;
   (ii) a falling-off preventing member made of an elastic material disposed in said second recess in a state of extending in the arranging direction of said probes and being fitted into said first recess in a state of close fit so as to prevent said probes from falling off said cover; and
   (iii) a needle presser extending in the arranging direction of said probes and disposed in said second recess for making said outer faces of said probes contact the conductive portions,
   wherein said cover further comprises a fifth recess communicating with an end portion of the falling-off preventing member longitudinally of said second recess, and wherein said falling-off preventing member is further fitted into said fifth recess in a state of close fit with the end portion.

2. An electrical connecting apparatus claimed in claim 1, wherein said probe further includes a third recess opening on the other side in said width direction and wherein at least a part of said needle presser is fitted into said third recess.

3. An electrical connecting apparatus claimed in claim 1, wherein said probes are pressed against said conductive portion by said needle presser.

4. An electrical connecting apparatus claimed in claim 1, wherein said probes have the other end side brought into contact with a face forming said second recess.

5. An electrical connecting apparatus claimed in claim 1, wherein said cover further comprises a plurality of slots communicating with said second recess and opening on the side of the base plate and on the side opposite thereto and arranged at intervals in the arranging direction of said probes, wherein said probes extend within said slots to project said tips from said slots toward the side opposite to the base plate.

6. An electrical connecting apparatus claimed in claim 5, wherein said cover comprises a fourth recess opening toward the side opposite to the base plate for receiving said device under test and communicating with said slots, said probes projecting their tips into said fourth recess.

* * * * *